US012283979B2

(12) United States Patent
Chen et al.

(10) Patent No.: US 12,283,979 B2
(45) Date of Patent: Apr. 22, 2025

(54) TRANSMITTER AND ASSOCIATED CALIBRATION METHOD

(71) Applicant: Realtek Semiconductor Corp., HsinChu (TW)

(72) Inventors: Beng-Meng Chen, HsinChu (TW); Hung-Han Chen, HsinChu (TW); Chien-Jung Huang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 527 days.

(21) Appl. No.: 17/729,007

(22) Filed: Apr. 26, 2022

(65) Prior Publication Data
US 2022/0376718 A1   Nov. 24, 2022

(30) Foreign Application Priority Data

May 19, 2021 (TW) .................................. 110118010

(51) Int. Cl.
*H04B 1/04* (2006.01)
*H03F 1/32* (2006.01)
*H03F 1/56* (2006.01)
*H03F 3/19* (2006.01)
*H03F 3/24* (2006.01)
*H03F 3/45* (2006.01)
*H04B 17/10* (2015.01)
(Continued)

(52) U.S. Cl.
CPC ......... *H04B 1/0475* (2013.01); *H03F 1/3211* (2013.01); *H03F 1/565* (2013.01); *H03F 3/19* (2013.01); *H03F 3/245* (2013.01); *H03F 3/45475* (2013.01); *H04B 17/102* (2015.01); *H04B 17/12* (2015.01); *H04B 17/13* (2015.01); *H03F 2200/451* (2013.01); *H03F 2203/45048* (2013.01)

(58) Field of Classification Search
CPC .... H04B 1/0475; H04B 17/102; H04B 17/12; H04B 17/13; H03F 1/3211; H03F 3/19; H03F 3/245; H03F 2203/45048; H03F 1/565; H03F 3/45475; H03F 2200/451
USPC .......... 332/103; 455/260; 375/295, 297, 296
See application file for complete search history.

(56) References Cited

U.S. PATENT DOCUMENTS

2022/0247368 A1* 8/2022 Chen .................... H03G 3/3042

FOREIGN PATENT DOCUMENTS

TW         I279093      4/2007
TW         202107859 A  2/2021

* cited by examiner

*Primary Examiner* — Arnold M Kinkead
(74) *Attorney, Agent, or Firm* — Winston Hsu

(57) ABSTRACT

The present invention provides a calibration method of a transmitter, wherein the transmitter includes a power amplifier, a transformer, an adjusting circuit and a coupling circuit, wherein the power amplifier receives an input signal to generate an amplified input signal, the transformer receives the amplified input signal to generate an output signal, the adjusting circuit adjusts phase and amplitude of a common mode signal of the amplified input signal to generate a first signal, and the coupling circuit generates a coupled signal to the output signal according to the first signal. In addition, the calibration method includes: controlling the adjusting circuit to have a specific setting of the phase and amplitude adjustment for the common mode signal, to effectively eliminate a second harmonic generated due to the power amplifier, to improve electromagnetic interference and signal quality.

13 Claims, 3 Drawing Sheets

(51) Int. Cl.
*H04B 17/12* (2015.01)
*H04B 17/13* (2015.01)

TRANSMITTER AND ASSOCIATED CALIBRATION METHOD

BACKGROUND OF THE INVENTION

1. Field of the Invention

The present invention relates to a transmitter within a wireless communication chip.

2. Description of the Prior Art

In a transmitter within a wireless communication chip, a power amplifier is used to amplify a signal to generate an output signal, and the output signal is transmitted through an antenna. However, when the power amplifier operates in a non-linear region, second harmonic or higher-order harmonics will appear in the output signal, which will affect the signal quality. In addition, the current transmitter does not have relevant circuit or parameters to adjust the intensity of the second harmonic, that is the intensity of the second harmonic generated by the power amplifier depends on its own circuit characteristics. Therefore, if the intensity of the second harmonic generated by the power amplifier is too high, the transmission power of the output signal needs to be reduced, which will affect the transmission of the output signal.

SUMMARY OF THE INVENTION

It is therefore an objective of the present invention to provide a circuit and method that can effectively eliminate the second harmonic generated by the power amplifier, so as to solve the problems described in the prior art.

In one embodiment of the present invention, a transmitter is disclosed, wherein the transmitter comprises a power amplifier, a transformer, a first adjusting circuit, a coupling circuit, a control circuit and a harmonic intensity calculation circuit. The power amplifier is configured to receive an input signal to generate an amplified input signal, wherein the amplified input signal is a differential signal. The transformer is configured to receive the amplified input signal to generate an output signal. The first adjusting circuit is configured to adjust a phase and an amplitude of a common mode signal of the amplified input signal to generate a first signal. The coupling circuit is configured to generate a coupled signal to the output signal according to the first signal. The control circuit is configured to controlling the first adjusting circuit to have a plurality of combinations, wherein the plurality of combinations comprise phase and amplitude adjustments that are not exactly the same. For the first adjusting circuit having any one of the combinations, the harmonic intensity calculation circuit calculates an intensity of a second harmonic of the output signal. In addition, the control circuit determines a specific combination based on intensities of the second harmonics corresponding to the combinations.

In one embodiment of the present invention, a calibration method of a transmitter is disclosed, wherein the transmitter comprises a power amplifier, a transformer, a first adjusting circuit, a coupling circuit, a control circuit and a harmonic intensity calculation circuit. The power amplifier is configured to receive an input signal to generate an amplified input signal, wherein the amplified input signal is a differential signal. The transformer is configured to receive the amplified input signal to generate an output signal. The first adjusting circuit is configured to adjust a phase and an amplitude of a common mode signal of the amplified input signal to generate a first signal. The coupling circuit is configured to generate a coupled signal to the output signal according to the first signal. The calibration method comprises the steps of: controlling the first adjusting circuit to have a plurality of combinations, wherein the plurality of combinations comprise phase and amplitude adjustments that are not exactly the same; for the first adjusting circuit having any one of the combinations, calculating an intensity of a second harmonic of the output signal; and determining a specific combination based on intensities of the second harmonics corresponding to the combinations.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
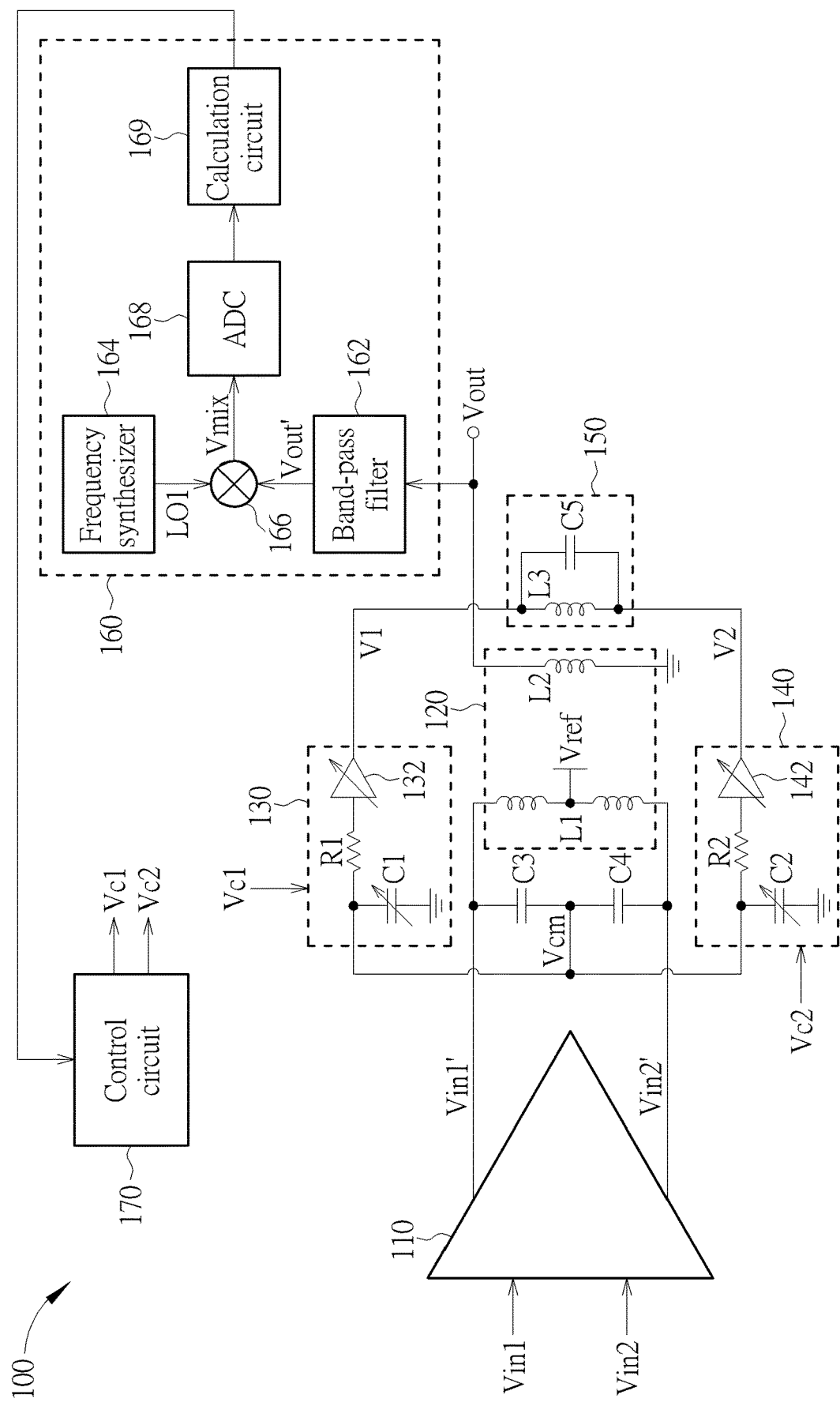
FIG. 1 is a diagram illustrating a transmitter according to one embodiment of the present invention.

FIG. 1 is a diagram illustrating a transmitter 100 according to one embodiment of the present invention. As shown in FIG. 1, the transmitter 110 comprises a power amplifier 110, a transformer 120, a first adjusting circuit 130, a second adjusting circuit 140, a coupling circuit 150, a harmonic intensity calculation circuit 160, a control circuit 170 and two capacitors C3 and C4. The transformer 120 is implemented by a balanced to unbalanced (BALUN) transformer, and the transformer 120 may comprise inductors L1 and L2, wherein a center tap of the inductor L1 is coupled to a reference voltage, and one terminal of the inductor L2 serves as an output terminal of the transmitter 100, and the other terminal of the inductor L2 is coupled to a ground voltage. The first adjusting circuit 130 comprises a phase adjusting circuit and an amplitude adjusting circuit, wherein the phase adjusting circuit is implemented by a resistor R1 and a capacitor C1, the amplitude adjusting circuit is implemented by an amplifier 132 with adjustable gain, and the capacitor C1 is a variable capacitor. The second adjusting circuit 140 comprises a phase adjusting circuit and an amplitude adjusting circuit, wherein the phase adjusting circuit is implemented by a resistor R2 and a capacitor C2, the amplitude adjusting circuit is implemented by an amplifier 142 with adjustable gain, and the capacitor C2 is a variable capacitor. The coupling circuit 150 comprises an inductor L3 and a capacitor C5. The harmonic intensity calculation circuit 160 comprises a band-pass filter 162, a frequency synthesizer 164, a mixer 166, an analog-to-digital converter (ADC) 168 and a calculation circuit 169. In this embodiment, the transmitter 100 can be applied to any wireless communication chip, such as a wireless communication chip supporting 2.4 GHz band, that is, the wireless communication chip can use a channel with a frequency range of 2.412 GHz-2.484 GHz for signal transmission and reception.

In the operation of the transmitter 100, the power amplifier 110 is used to receive the input signals Vin1 and Vin2 to generate amplified input signals Vin1' and Vin2', and then the transformer 120 is used to convert the amplified input signals Vin1' and Vin2' (differential signal) into a single-ended output signal Vout, where the output signal Vout is broadcasted through an antenna.

As mentioned in the prior art, since the amplified input signals Vin1' and Vin2' have the second harmonic (second-order harmonic), the output signal Vout will also have the second harmonic, which affects its signal quality.

Because the second harmonic of the amplified input signals Vin1' and Vin2' are mainly derived from the components of a common-mode signal, in order to eliminate the second harmonic in the output signal Vout, the capacitors C3 and C4 are used as a voltage divider to obtain the common mode signal Vcm of the amplified input signal Vin1' and Vin2'. In this embodiment, the capacitors C3 and C4 have the same capacitance. The first adjusting circuit 130 adjusts the phase and amplitude of the common mode signal Vcm to generate a first signal V1 to one terminal of the inductor L3 of the coupling circuit 150, and the second adjusting circuit 140 adjusts the phase and amplitude of the common mode signal Vcm to generate a second signal V2 to the other terminal of the inductor L3 in the coupling circuit 150. At this time, both the inductor L3 and the inductor L2 can be regarded as a balanced-to-unbalanced converter, and the signal from the inductor L3 is used to generate a coupled signal to the output signal Vout for eliminating the second harmonic of the output signal Vout.

In practice, the terminal of the inductor L3 of the coupling circuit 150 can be selectively connected to the reference voltage Vref through a switch to control the direction of the current in the coupling circuit 150. In addition, the first adjusting circuit 130 can be selectively connected to the coupling circuit 150 through a switch, so that the user or designer can enable or disable the second harmonic elimination function provided by the coupling circuit 150.

In order to effectively eliminate the second harmonic in the output signal Vout, the transmitter 100 additionally designs the harmonic intensity calculation circuit 160 and the control circuit 170 to determine optimal phase adjustment amount and amplitude adjustment amount of the first adjusting circuit 130 and the second adjusting circuit 140, that is to determine the optimal capacitance of the capacitors C1 and C2 and the optimal gain of the amplifiers 132 and 142. Specifically, during a test phase of the transmitter 100 or an initialization phase of the transmitter 100 when it is just powered on, the control circuit 170 can control the capacitors C1 and C2 to have different capacitances and control the amplifiers 132 and 142 to have different gains by using the control signals Vc1 and Vc2, to obtain many combinations of the different phase and amplitude adjustments of the first adjusting circuit 130 and the second adjusting circuit 140 (each combination comprises one phase adjustment and one amplitude adjustment of the first adjusting circuit 130 and one phase adjustment and one amplitude adjustment of the second adjusting circuit 140). The harmonic intensity calculation circuit 160 calculates the intensity of the second harmonic in the output signal Vout for each combination. Finally, after determining the intensity of the second harmonic of each combination, the control circuit 170 will select the combination with the lowest second harmonic intensity as a specific combination, and use the capacitances of the capacitors C1 and C2 and the gains of the amplifier 132 and 142 included in the specific combination to set the capacitors C1 and C2 and the amplifiers 132 and 134, respectively, for the subsequent operation of the transmitter 100.

Figure 2:
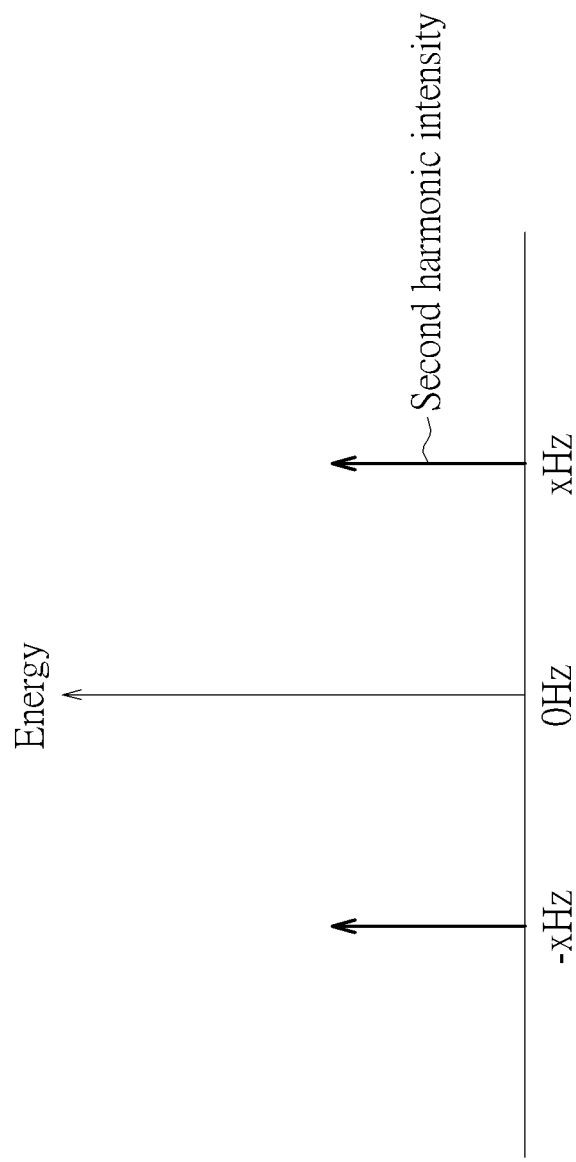
FIG. 2 shows a diagram of a power spectral density.

In detail, for any combination of the capacitances of the capacitors C1 and C2 and the gains of the amplifiers 132 and 142, assuming that the transmitter 100 is applied to the wireless communication chip with 2.4 GHz band, and the frequency range of the output signal Vout is ranging from 2.412 GHz to 2.484 GHz, the band-pass filter 162 can filter the output signal Vout to generate a filtered signal Vout' that contains the second harmonic. That is, a pass band of the band-pass filter 162 includes the frequency band around 4.8 GHz, and other frequency components (such as 2.4 GHz) in the output signal Vout will be filtered out. Then, the frequency synthesizer 164 generates a radio frequency signal LO1, wherein the frequency of the radio frequency signal LO1 is close to the frequency of the second harmonic, that is, the frequency of the radio frequency signal LO1 can be ranging from 4.8 GHz to 5 GHz. The mixer 166 mixes the filtered signal Vout' with the radio frequency signal LO1 to generate a mixed signal Vmix, wherein the purpose of the mixer 166 is to down-convert the filtered signal Vout' to a base-band signal. Then, the ADC 168 performs analog-to-digital conversion on the mixed signal Vmix to generate a digital signal, and the calculation unit 169 calculates an intensity value according to the digital signal, wherein the intensity value can be used to represent the intensity of the second harmonic in the output signal Vout. For example, the calculation unit 169 may perform operations on the digital signal to obtain a power spectral density (PSD) as shown in FIG. 2, wherein the energy corresponding to the frequency 'x' in the power spectral density is the intensity of the second harmonic in the output signal Vout, where the value of 'x' is determined by a frequency difference between a frequency of the RF signal LO1 and the second-order harmonic. For example, if the frequency of the radio frequency signal LO1 is exactly equal to the frequency of the second harmonic (i.e., about 4.8 GHz), then 'x' is very close to 0 Hz; and if the frequency of the radio frequency signal LO1 is 5 GHz, then 'x' is about 200 MHz. The calculation unit 169 can integrate the energy corresponding to a specific frequency range comprising the frequency 'x' in the power spectral density to obtain the intensity of the second harmonic, and transmit the intensity of the second harmonic to the control circuit 170.

Briefly summarized, by using the first adjusting circuit 130, the second adjusting circuit 140 and the coupling circuit 150 that can be used to eliminate the second harmonic in the output signal Vout, and by further using the control circuit 170 and the harmonic intensity calculation circuit 160 to determine the most suitable phase and amplitude adjustments of the first adjusting circuit 130 and the second adjusting circuit 140, the output signal Vout generated by the transmitter 100 can have the lowest intensity of second harmonic, so as to effectively improve electromagnetic interference and signal quality.

Figure 3:
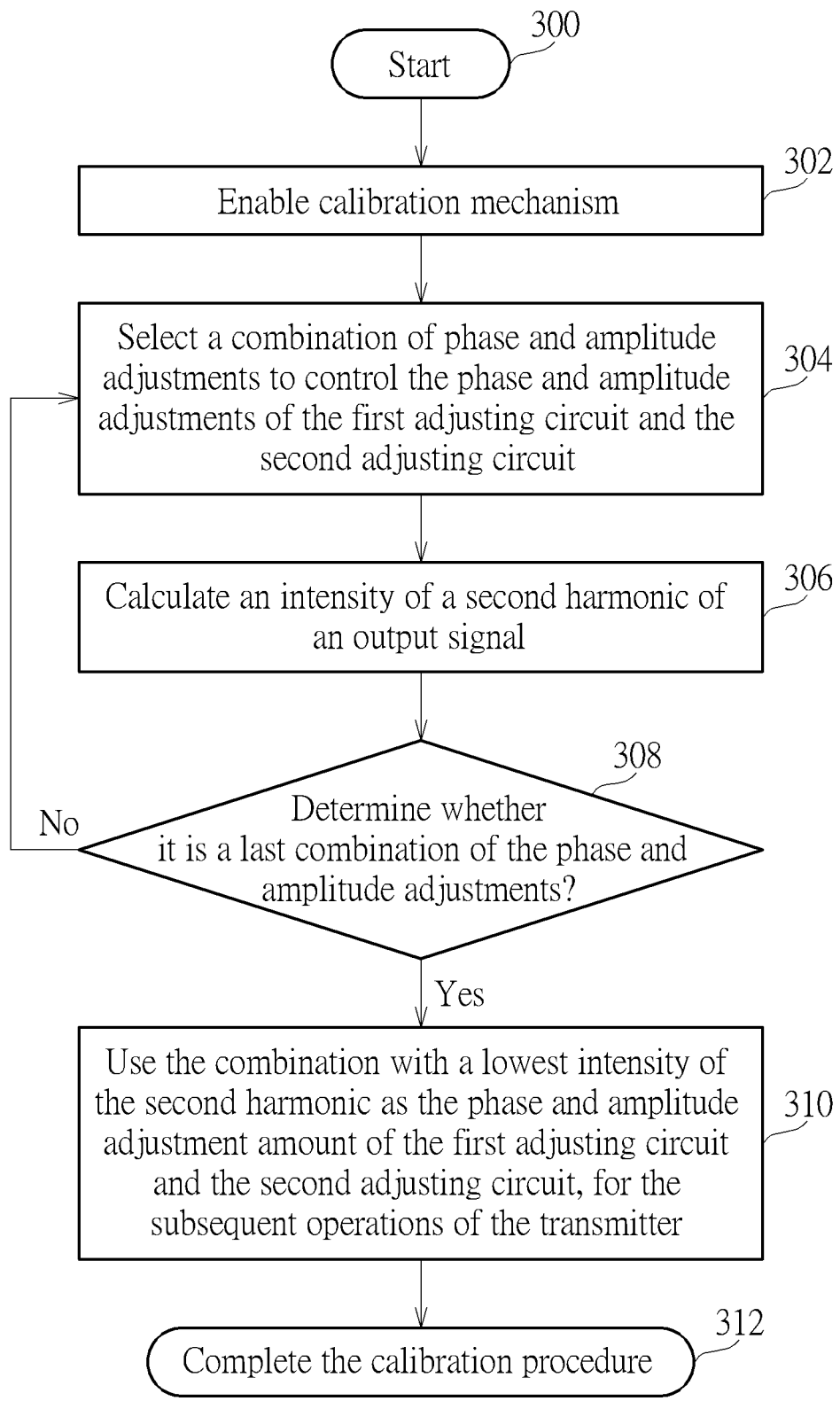
FIG. 3 is a flowchart of a calibration method of a first adjusting circuit and a second adjusting circuit according to one embodiment of the present invention.

FIG. 3 is a flowchart of a calibration method of the first adjusting circuit 130 and the second adjusting circuit 140 according to one embodiment of the present invention. Referring to the above embodiments together, the flow is described as follows.

Step 300: the flow starts.

Step 302: enable calibration mechanism.

Step 304: select a combination of phase and amplitude adjustments to control the phase and amplitude adjustments of the first adjusting circuit and the second adjusting circuit.

Step 306: calculate an intensity of a second harmonic of an output signal.

Step 308: determine whether it is a last combination of the phase and amplitude adjustments, if yes, the flow enters Step 310; and if not, the flow goes back to Step 306 to select a next combination of the phase and amplitude adjustments.

Step 310: use the combination with a lowest intensity of the second harmonic as the phase and amplitude adjustment amount of the first adjusting circuit and the second adjusting circuit, for the subsequent operations of the transmitter Step 312: complete the calibration procedure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmitter, comprising: a power amplifier, configured to receive an input signal to generate an amplified input signal, wherein the amplified input signal is a differential signal; a transformer, configured to receive the amplified input signal to generate an output signal; a first adjusting circuit, configured to adjust a phase and an amplitude of a common mode signal of the amplified input signal to generate a first signal; a coupling circuit, configured to generate a coupled signal to the output signal according to the first signal; a control circuit, configured to control the first adjusting circuit to have a plurality of combinations in sequence, wherein the plurality of combinations comprise different phase and amplitude adjustments of the first adjusting circuit, respectively; and a harmonic intensity calculation circuit, wherein for the first adjusting circuit having any one of the combinations, the harmonic intensity calculation circuit calculates an intensity of a second harmonic of the output signal, so that the harmonic intensity calculation circuit generates a plurality of intensities of the second harmonics respectively corresponding to the plurality of combinations; wherein the control circuit further determines a specific combination among the plurality of combinations based on the plurality of intensities of the second harmonics corresponding to the plurality of combinations.

2. The transmitter of claim 1, further comprising:
a second adjusting circuit, configured to adjust the phase and the amplitude of the common mode signal of the amplified input signal to generate a second signal;
wherein the coupling circuit generates the coupled signal to the output signal according to the first signal and the second signal.

3. The transmitter of claim 1, wherein the control circuit determines a combination corresponding to a lowest intensity of the second harmonic among the intensities of the second harmonics as the specific combination, for determining the phase and amplitude adjustments of the first adjustment circuit.

4. The transmitter of claim 1, wherein the harmonic intensity calculation circuit comprises:
a band-pass filter, configured to filter the output signal to generate a filtered signal, wherein the filtered signal comprises the second harmonic of the output signal;
a mixer, configured to mix the filtered signal with a radio frequency signal to generate a mixed signal; and
a calculation circuit, configured to calculate the intensity of the second harmonic of the output signal according to the mixed signal.

5. The transmitter of claim 4, wherein the harmonic intensity calculation circuit further comprises:
an analog-to-digital converter, coupled between the mixer and the calculation circuit, configured to perform an analog-to-digital conversion on the mixed signal to generate a digital signal;
wherein the calculation circuit calculates the intensity of the second harmonic of the output signal according to the digital signal.

6. The transmitter of claim 4, wherein the calculation unit obtains a power spectral density according to the mixed signal, and integrates a specific frequency range of the power spectral density according to a frequency difference between the mixed signal and the radio frequency signal to generate the intensity of second harmonic of the output signal.

7. The transmitter of claim 4, wherein the output signal is in 2.4 GHz band, the second harmonic of the output signal is in 4.8 GHz band, and a frequency of the radio frequency signal is ranging from 4.8 GHz to 5 GHz.

8. A calibration method of a transmitter, wherein the transmitter comprises: a power amplifier, configured to receive an input signal to generate an amplified input signal, wherein the amplified input signal is a differential signal; a transformer, configured to receive the amplified input signal to generate an output signal; a first adjusting circuit, configured to adjust a phase and an amplitude of a common mode signal of the amplified input signal to generate a first signal; and a coupling circuit, configured to generate a coupled signal to the output signal according to the first signal; and the calibration method comprises the steps of: controlling the first adjusting circuit to have a plurality of combinations in sequence, wherein the plurality of combinations comprise different phase and amplitude adjustments of the first adjusting circuit, respectively; for the first adjusting circuit having any one of the combinations, calculating an intensity of a second harmonic of the output signal, so that a plurality of intensities of the second harmonics respectively corresponding to the plurality of combinations are generated; and determining a specific combination among the plurality of combinations based on the plurality of intensities of the second harmonics corresponding to the plurality of combinations.

9. The calibration method of claim 8, wherein the step of determining the specific combination based on the intensities of the second harmonics corresponding to the combinations comprises:
determining a combination corresponding to a lowest intensity of the second harmonic among the intensities of the second harmonics as the specific combination, for determining the phase and amplitude adjustments of the first adjustment circuit.

10. The calibration method of claim 8, wherein the step of calculating the intensity of the second harmonic of the output signal comprises:
filtering the output signal to generate a filtered signal, wherein the filtered signal comprises the second harmonic of the output signal;
mixing the filtered signal with a radio frequency signal to generate a mixed signal; and
calculating the intensity of the second harmonic of the output signal according to the mixed signal.

11. The calibration method of claim 10, wherein the step of calculating the intensity of the second harmonic of the output signal further comprises:
performing an analog-to-digital conversion on the mixed signal to generate a digital signal; and the step of calculating the intensity of the second harmonic of the output signal according to the mixed signal comprises:
calculating the intensity of the second harmonic of the output signal according to the digital signal.

12. The calibration method of claim 10, wherein the step of calculating the intensity of the second harmonic of the output signal according to the mixed signal comprises:
obtaining a power spectral density according to the mixed signal; and
integrating a specific frequency range of the power spectral density according to a frequency difference between the mixed signal and the radio frequency signal to generate the intensity of second harmonic of the output signal.

13. The calibration method of claim 10, wherein the output signal is in 2.4 GHz band, the second harmonic of the output signal is in 4.8 GHz band, and a frequency of the radio frequency signal is ranging from 4.8 GHz to 5 GHz.

* * * * *